(12) United States Patent
Huang et al.

(10) Patent No.: US 9,673,340 B1
(45) Date of Patent: Jun. 6, 2017

(54) SEMICONDUCTOR DEVICE STRUCTURE

(71) Applicant: TAIWAN SEMICONDUCTOR MANUFACTURING CO., LTD., Hsinchu (TW)

(72) Inventors: I-Chen Huang, Hsinchu (TW); Kuang-Hsin Chen, Taoyuan (TW); Yung-Hsien Wu, Hsinchu (TW); Wen-Chao Shen, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/154,211

(22) Filed: May 13, 2016

(51) Int. Cl.
| | |
|---|---|
| H01L 27/148 | (2006.01) |
| H01L 29/792 | (2006.01) |
| H01L 29/24 | (2006.01) |
| H01L 29/267 | (2006.01) |
| H01L 29/51 | (2006.01) |
| G11C 16/04 | (2006.01) |
| G11C 16/14 | (2006.01) |

(52) U.S. Cl.
CPC ........ H01L 29/792 (2013.01); G11C 16/0466 (2013.01); G11C 16/14 (2013.01); H01L 29/24 (2013.01); H01L 29/267 (2013.01); H01L 29/513 (2013.01)

(58) Field of Classification Search
CPC ........... H01L 21/823462; H01L 29/792; H01L 29/24; H01L 29/267; H01L 29/513; H01L 21/823857; H01L 29/7856; H01L 27/11563; H01L 29/4234; H01L 29/66833; H01L 29/802; H01L 29/808; H01L 31/1124; H01L 31/1127
See application file for complete search history.

(56) References Cited

U.S. PATENT DOCUMENTS 8,232,585 B2 * 7/2012 Mouli ................ H01L 29/1066
257/272

* cited by examiner

*Primary Examiner* — Cuong B Nguyen
(74) *Attorney, Agent, or Firm* — Birch, Stewart, Kolasch & Birch, LLP (57) ABSTRACT

A semiconductor device structure is provided. The semiconductor device structure includes a semiconductor substrate. The semiconductor device structure includes a gate stack over the semiconductor substrate. The gate stack includes a first insulating layer, a first layer, a second layer, a second insulating layer, and a gate electrode. The first insulating layer separates the semiconductor substrate from the first layer. The second layer is between the first layer and the second insulating layer. The gate electrode is over the second insulating layer. There is a P-N junction between the first layer and the second layer. The semiconductor device structure includes a first doped region and a second doped region in the semiconductor substrate. The first layer, the first doped region, and the second doped region have a first type conductivity, which is opposite to a second type conductivity of the second layer.

20 Claims, 5 Drawing Sheets

SEMICONDUCTOR DEVICE STRUCTURE

BACKGROUND

Non-volatile memory devices are used in applications that require stored information to be retained even when the memory devices are not powered. Examples of non-volatile memory devices include read-only memories, magnetic computer storage devices (e.g., hard disks), optical disc drives, erasable programmable read-only memories, and flash memories.

Flash memories are used in a wide variety of electronic applications. Flash memories are able to store one or more bits of data in the form of electric charges. However, although existing manufacturing processes for forming flash memories have been generally adequate for their intended purposes, as the reliability requirement for flash memories increases, they have not been entirely satisfactory in all respects.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1A:
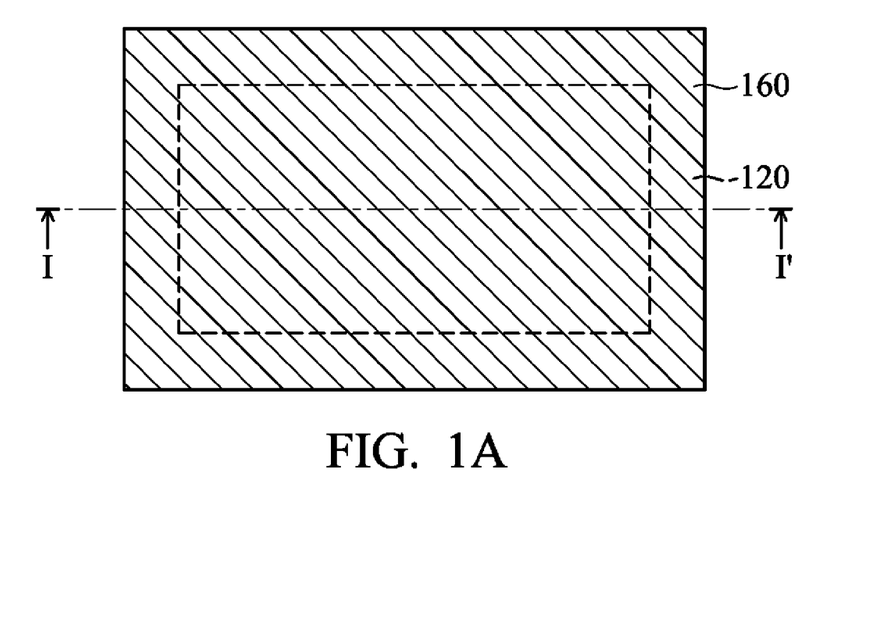
FIGS. 1A-1B are top views of various stages of a process for forming a semiconductor device structure, in accordance with some embodiments.
Figure 1B:
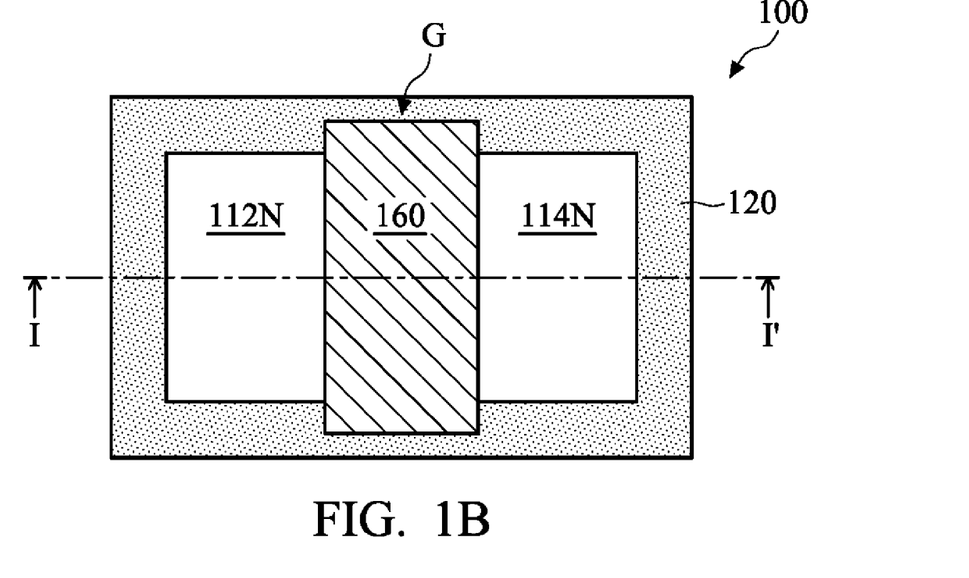
Figure 2A:
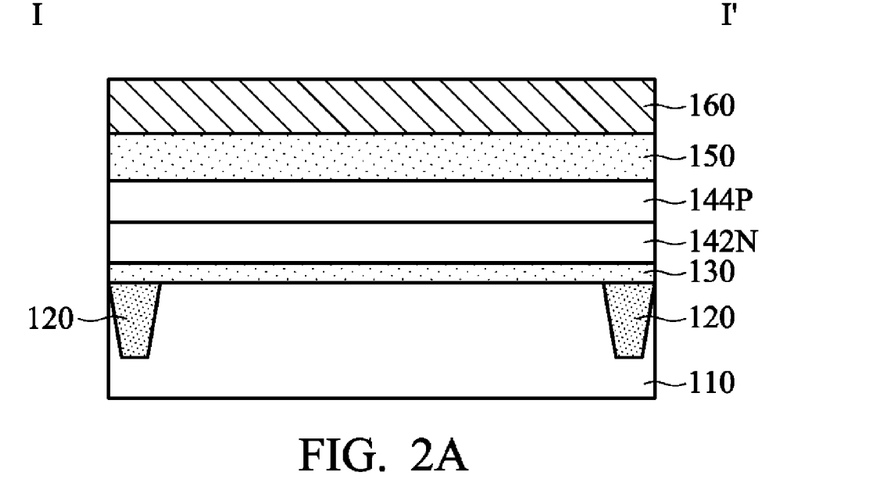
FIGS. 2A-2B are cross-sectional views of the semiconductor device structure along a sectional line I-I' in FIGS. 1A-1B, in accordance with some embodiments.
Figure 2B:
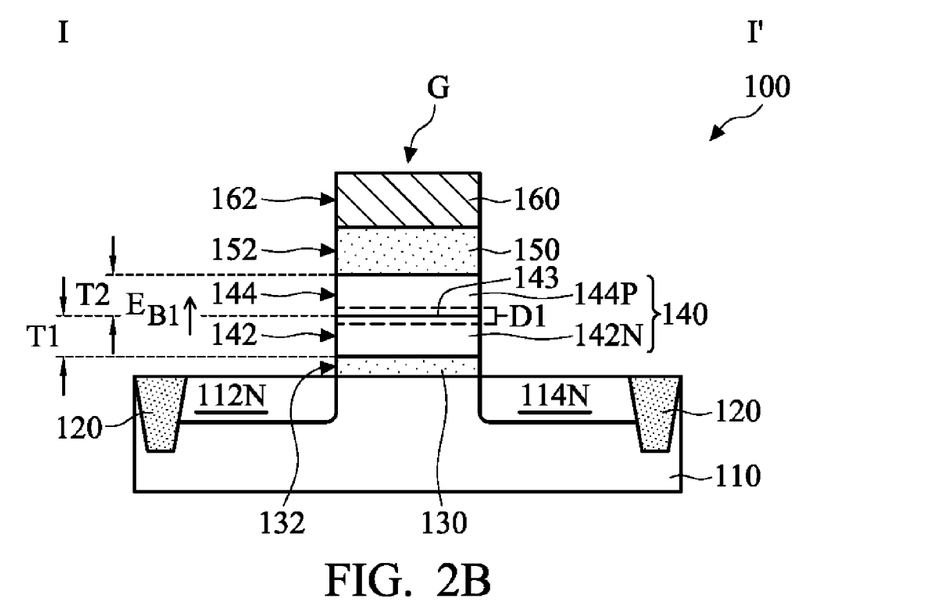

FIGS. 1A-1B are top views of various stages of a process for forming a semiconductor device structure 100, in accordance with some embodiments. FIGS. 2A-2B are cross-sectional views of the semiconductor device structure 100 along a sectional line I-I' in FIGS. 1A-1B, in accordance with some embodiments.

As shown in FIGS. 1A and 2A, a semiconductor substrate 110 is provided. The semiconductor substrate 110 includes a semiconductor wafer (such as a silicon wafer) or a portion of a semiconductor wafer.

In some embodiments, the semiconductor substrate 110 is made of an elementary semiconductor material including silicon or germanium in a single crystal, polycrystal, or amorphous structure. In some other embodiments, the semiconductor substrate 110 is made of a compound semiconductor such as silicon carbide, gallium arsenide, gallium phosphide, indium phosphide, indium arsenide, an alloy semiconductor such as SiGe, or GaAsP, or a combination thereof. In some embodiments, the semiconductor substrate 110 includes multi-layer semiconductors, semiconductor-on-insulator (SOI) (such as silicon-on-insulator or germanium-on-insulator), or a combination thereof.

As shown in FIGS. 1A and 2A, a shallow trench isolation (STI) structure 120 is formed in the semiconductor substrate 110, in accordance with some embodiments. The STI structure 120 is configured to define and electrically isolate various device elements (not shown) formed in the semiconductor substrate 110, in accordance with some embodiments.

Examples of the various device elements include memory cells, transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, another suitable element, or a combination thereof. Various prowesses are performed to form the various device elements, such as deposition, etching, implantation, photolithography, annealing, planarization, another applicable process, or a combination thereof.

The STI structure 120 is made of a dielectric material, in accordance with some embodiments. The dielectric material includes silicon oxide, silicon nitride, silicon oxynitride, fluoride-doped silicate glass (FSG), a low-K dielectric material, other suitable materials, or combinations thereof, in accordance with some embodiments. The STI structure 120 is formed by using an isolation technology, such as local oxidation of semiconductor (LOCOS), shallow trench isolation (STI), or the like, in accordance with some embodiments.

In some embodiments, the formation of the STI structure 120 includes patterning the semiconductor substrate 110 by performing a photolithography process and an etching process on the semiconductor substrate 110 so as to form a trench in the semiconductor substrate 110; and filling the trench with the dielectric material.

The etching process for forming the trench includes a dry etching process, a wet etching process, a plasma etching process, or a combination thereof, in accordance with some embodiments. The filling of the trench includes a chemical vapor deposition process, in accordance with some embodiments. In some embodiments, the filled trench has a multi-layer structure, such as a thermal oxide liner layer filled with silicon nitride or silicon oxide.

As shown in FIGS. 1A and 2A, an insulating layer 130 is formed over the semiconductor substrate 110 and the STI structure 120, in accordance with some embodiments. The insulating layer 130 is also referred to as a tunnel layer, in accordance with some embodiments. The insulating layer 130 includes silicon oxide or another suitable insulating material, such as a high dielectric constant dielectric material. The insulating layer 130 is formed by a chemical vapor deposition process or another suitable material.

As shown in FIGS. 1A and 2A, a first layer 142N is formed over the insulating layer 130, in accordance with some embodiments. The first layer 142N has an N-type conductivity, in accordance with some embodiments. The first layer 142N includes an N-type oxide semiconductor, in accordance with some embodiments. The N-type oxide semiconductor includes zinc oxide, tin dioxide, titanium oxide, zinc tin oxide, indium oxide, indium zinc oxide, indium gallium zinc oxide, or another suitable N-type oxide semiconductor material.

In some embodiments, the first layer 142N includes an N-type oxynitride semiconductor. The N-type oxynitride semiconductor includes zinc oxynitride, tin oxynitride, titanium oxynitride, zinc tin oxynitride, indium oxynitride, indium zinc oxynitride, indium gallium zinc oxynitride, or another suitable N-type oxynitride semiconductor material. The first layer 142N is formed using a chemical vapor deposition process or another suitable process.

The hardness, the density, and the trapping sites of the oxynitride semiconductor material may be greater than that of the oxide semiconductor material. Therefore, the layer made of the oxynitride semiconductor material may have better reliability and better charge trapping ability than that of the layer made of the oxide semiconductor material.

As shown in FIGS. 1A and 2A, a second layer 144P is formed over the first layer 142N, in accordance with some embodiments. The second layer 144P has a P-type conductivity, in accordance with some embodiments. The first layer 142N and the second layer 144P are made of different materials, in accordance with some embodiments.

The second layer 144P includes a P-type oxide semiconductor, in accordance with some embodiments. The P-type oxide semiconductor includes nickel oxide, tin oxide, copper oxide, or another suitable P-type oxide semiconductor material. The P-type oxide semiconductor is different from the N-type oxide semiconductor, in accordance with some embodiments.

In some embodiments, the second layer 144P includes a P-type oxynitride semiconductor. The P-type oxynitride semiconductor includes nickel oxynitride, tin oxynitride, copper oxynitride, or another suitable P-type oxynitride semiconductor. The P-type oxynitride semiconductor is different from the N-type oxynitride semiconductor, in accordance with some embodiments. The second layer 144P is formed using a chemical vapor deposition process and an annealing process or another suitable process.

As shown in FIGS. 1A and 2A, an insulating layer 150 is formed over the second layer 144P, in accordance with some embodiments. The insulating layer 150 is also referred to as a blocking layer, in accordance with some embodiments. The insulating layer 150 includes silicon oxide, silicon oxynitride, or another dielectric material having a high dielectric constant, in accordance with some embodiments. The insulating layer 150 is formed using a chemical vapor deposition process, in accordance with some embodiments.

As shown in FIGS. 1A and 2A, a gate electrode layer 160a is formed over the insulating layer 150, in accordance with some embodiments. The gate electrode layer 160a includes metal (e.g. tungsten), alloy (e.g. TiAl), metal nitride (e.g. titanium nitride or tantalum nitride), metal silicide (e.g. tungsten silicide), or another suitable conductive material. The gate electrode layer 160a is formed using a chemical vapor deposition process, a physical vapor deposition process, or another suitable process.

As shown in FIGS. 1B and 2B, portions of the insulating layer 130, the first layer 142N, the second layer 144P, the insulating layer 150, and the gate electrode layer 160a are removed, in accordance with some embodiments. The removal process includes a photolithography process and an etching process, in accordance with some embodiments. After the removal process, the remaining gate electrode layer 160a forms a gate electrode 160, in accordance with some embodiments.

After the removal process, the STI structure 120 and portions of the semiconductor substrate 110 are exposed by the insulating layer 130, the first layer 142N, the second layer 144P, the insulating layer 150, and the gate electrode 160, in accordance with some embodiments. After the removal process, sidewalls 132, 142, 144, 152, and 162 of the insulating layer 130, the first layer 142N, the second layer 144P, the insulating layer 150, and the gate electrode 160 are aligned with each other, in accordance with some embodiments.

The insulating layer 130, the first layer 142N, the second layer 144P, the insulating layer 150, and the gate electrode 160 together form a gate stack G, in accordance with some embodiments. In some embodiments, a thickness T1 of the first layer 142N ranges from about 1 nm to about 100 nm. In some embodiments, a thickness T2 of the second layer 144P ranges from about 1 nm to about 100 nm.

As shown in FIGS. 1B and 2B, doped regions 112N and 114N are formed in the exposed portions of the semiconductor substrate 110 and on two opposite sides of the gate stack G, in accordance with some embodiments. The doped regions 112N and 114N are doped with N-type dopants, such as nitrogen (N), phosphorus (P), arsenic (As), antimony (Sb), or bismuth (Bi).

The doped regions 112N and 114N are configured to be a source region and a drain region, respectively, in accordance with some embodiments. The doped regions 112N and 114N and the first layer 142N have the N-type conductivity, which is opposite to the P-type conductivity of the second layer 144P.

In this step, the semiconductor device structure 100 is substantially formed, in accordance with some embodiments. The semiconductor device structure 100 is also referred to as a memory device structure, in accordance with some embodiments. The first layer 142N and the second layer 144P together form a charge trapping structure 140, in accordance with some embodiments.

There is a P-N junction 143 between the first layer 142N and the second layer 144P, in accordance with some embodiments. In some embodiments, a depiction region D1 is formed around the P-N junction 143 and in the first layer 142N and the second layer 144P. In some embodiments, a direction $E_{B1}$ of an internal built-in electric field at the depletion region D1 is from the first layer 142N to the second layer 144P.

During a program operation, electrons in the semiconductor substrate 110 are driven into the first layer 142N through the insulating layer 130 (i.e. the tunnel layer) by applying a voltage difference between the gate electrode 160 and the semiconductor substrate 110, in accordance with some embodiments.

The electrons are trapped in the first layer 142N, in accordance with some embodiments. The internal built-in electric field at the depletion region D1 prevents the trapped electrons in the first layer 142N from flowing to the gate electrode 160 through the second layer 144P and the insulating layer 150, in accordance with some embodiments.

Therefore, the internal built-in electric field at the depletion region D1 improves the trapped electron storage reliability (i.e. the data storage reliability) of the semiconductor device structure 100 (i.e. the memory device structure), in accordance with some embodiments.

The insulating layer 150 is thicker than the insulating layer 130, in accordance with some embodiments. Therefore, during the program operation, the electrons from the semiconductor substrate 110 are able to tunnel through the insulating layer 130, and the insulating layer 150 is able to prevent the electrons from flowing to the gate electrode 160, in accordance with some embodiments.

During an erase operation, the trapped electrons in the first layer 142N are driven to the semiconductor substrate 110 by applying a voltage difference between the gate electrode 160 and the semiconductor substrate 110, in accordance with some embodiments.

During the erase operation, the internal built-in electric field at the depletion region D1 helps the trapped electrons in the first layer 142N to flow to the semiconductor substrate 110, in accordance with some embodiments. Therefore, the internal built-in electric field at the depletion region D1 reduces the erase operation voltage, in accordance with some embodiments. In some embodiments, the erase operation voltage is less than 10 V. In some embodiments, the erase operation voltage ranges from about 3V to about 5V.

In some embodiments, a peripheral charge pump circuitry (not shown) is formed over the semiconductor substrate 110 and is electrically connected to the gate electrode 160 and/or the doped regions 112N and 114N. The peripheral charge pump circuitry is configured to raise the erase operation voltage, in accordance with some embodiments.

Since there is no need to provide a high erase operation voltage (e.g. greater than 10 V), the design of the peripheral charge pump circuitry is simplified, in accordance with some embodiments. Therefore, the process for forming the semiconductor device structure 100 is simplified as well.

In the semiconductor device structure 100, the insulating layer 130 separates the semiconductor substrate 110 from the first layer 142N, in accordance with some embodiments. The second layer 144P is between the first layer 142N and the insulating layer 150, in accordance with some embodiments. The gate electrode 160 is over the insulating layer 150, in accordance with some embodiments.

The first layer 142N is in direct contact with the second layer 144P, in accordance with some embodiments. The first layer 142N is in direct contact with the insulating layer 130, in accordance with some embodiments. The insulating layer 150 is in direct contact with the gate electrode 160 and the second layer 144P, in accordance with some embodiments. The insulating layer 130 is in direct contact with the semiconductor substrate 110, in accordance with some embodiments.

In some embodiments, the semiconductor substrate 110 has a P-type conductivity. The semiconductor substrate 110 is doped with P-type dopants, such as boron (B), aluminum (Al), gallium (Ga), indium (In), and thallium (Tl). The semiconductor substrate 110 and the second layer 144P have the same type of conductivity, in accordance with some embodiments.

Figure 3A:
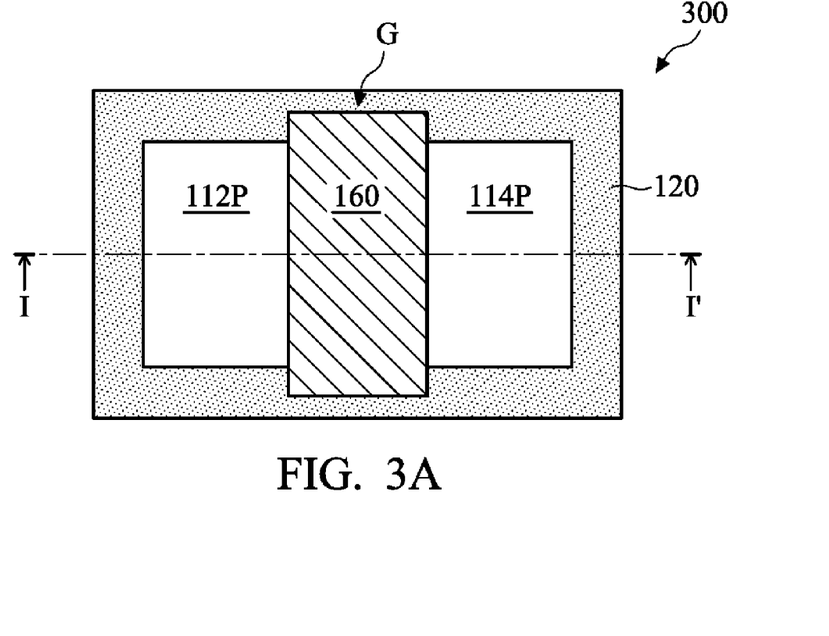
FIG. 3A is a top view of a semiconductor device structure, in accordance with some embodiments.
Figure 3B:
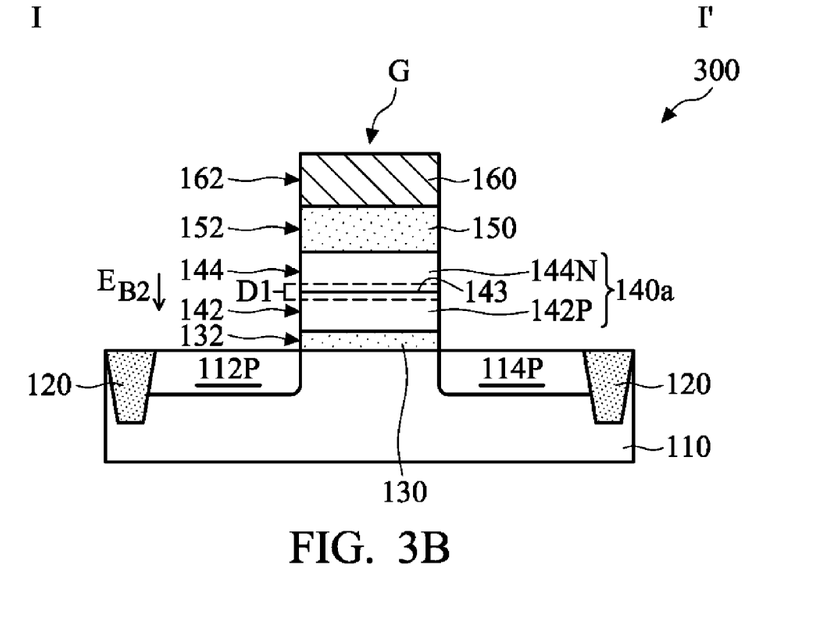
FIG. 3B is a cross-sectional view of the semiconductor device structure along a sectional line I-I' in FIG. 3A, in accordance with some embodiments.

FIG. 3A is a top view of a semiconductor device structure 300, in accordance with some embodiments. FIG. 3B is a cross-sectional view of the semiconductor device structure 300 along a sectional line I-I' in FIG. 3A, in accordance with some embodiments.

As shown in FIGS. 3A and 3B, the material and the structure of the semiconductor device structure 300 are similar to that of the semiconductor device structure 100, except that the doped regions 112P and 114P and the charge trapping structure 140a are different from the doped regions 112N and 114N and the charge trapping structure 140, in accordance with some embodiments.

The type of conductivity and the materials of the doped regions 112P and 114P, the first layer 142P, and the second layer 144N of the charge trapping structure 140a are different from that of the doped regions 112N and 114N, the first layer 142N, and the second layer 144P of the charge trapping structure 140, respectively, in accordance with some embodiments.

The doped regions 112P and 114P have a P-type conductivity, in accordance with some embodiments. The doped regions 112P and 114P are doped with P-type dopants, such as boron (B), aluminum (Al), gallium (Ga), indium (In), and thallium (Tl).

As shown in FIGS. 3A and 3B, a first layer 142P is formed over the insulating layer 130, in accordance with some embodiments. The first layer 142P has a P-type conductivity, in accordance with some embodiments. The first layer 142P includes a P-type oxide semiconductor, in accordance with some embodiments.

The P-type oxide semiconductor includes nickel oxide, tin oxide, copper oxide, or another suitable P-type oxide semiconductor material. The P-type oxide semiconductor is different from the N-type oxide semiconductor, in accordance with some embodiments.

In some embodiments, the first layer 142P includes a P-type oxynitride semiconductor. The P-type oxynitride semiconductor includes nickel oxynitride, tin oxynitride, copper oxynitride, or another suitable P-type oxynitride semiconductor. The P-type oxynitride semiconductor is different from the N-type oxynitride semiconductor, in accordance with some embodiments. The first layer 142P is formed using a chemical vapor deposition process and an annealing process or another suitable process.

As shown in FIGS. 3A and 3B, a second layer 144N is formed over the first layer 142P, in accordance with some embodiments. The second layer 144N has an N-type conductivity, in accordance with some embodiments. The first layer 142P and the second layer 144N are made of different materials, in accordance with some embodiments.

The second layer 144N includes an N-type oxide semiconductor, in accordance with some embodiments. The N-type oxide semiconductor includes zinc oxide, tin dioxide, titanium oxide, zinc tin oxide, indium oxide, indium zinc oxide, indium gallium zinc oxide, or another suitable N-type oxide semiconductor material.

In some embodiments, the second layer 144N includes an N-type oxynitride semiconductor. The N-type oxynitride semiconductor includes zinc oxynitride, tin oxynitride, titanium oxynitride, zinc tin oxynitride, indium oxynitride, indium zinc oxynitride, indium gallium zinc oxynitride, or another suitable N-type oxynitride semiconductor material.

The second layer 144N is formed using a chemical vapor deposition process and an annealing process or another suitable process. The doped regions 112P and 114P and the first layer 142P have the P-type conductivity, which is opposite to the N-type conductivity of the second layer 144N.

There is a P-N junction 143 between the first layer 142P and the second layer 144N, in accordance with some embodiments. In some embodiments, a depletion region D1 is formed around the P-N junction 143 and in the first layer 142P and the second layer 144N. In some embodiments, a direction $E_{B2}$ of an internal built-in electric field at the depletion region D1 is from the second layer 144N to the first layer 142P.

During a program operation, holes in the semiconductor substrate 110 are driven into the first layer 142P through the insulating layer 130 (i.e. the tunnel layer) by applying a voltage difference between the gate electrode 160 and the semiconductor substrate 110, in accordance with some embodiments.

The holes are trapped in the first layer 142P, in accordance with some embodiments. The internal built-in electric field at the depletion region D1 prevents the trapped holes in the first layer 142P from flowing to the gate electrode 160 through the second layer 144N and the insulating layer 150, in accordance with some embodiments. Therefore, the internal built-in electric field at the depletion region D1 improves the trapped hole storage reliability (i.e. the data storage reliability) of the semiconductor device structure 300 (i.e. the memory device structure), in accordance with some embodiments.

The insulating layer 150 is thicker than the insulating layer 130, in accordance with some embodiments. Therefore, during the program operation, the holes from the semiconductor substrate 110 are able to tunnel through the insulating layer 130, and the insulating layer 150 is able to prevent the holes from flowing to the gate electrode 160, in accordance with some embodiments.

During an erase operation, the trapped holes in the first layer 142P are driven to the semiconductor substrate 110 by applying a voltage difference between the gate electrode 160 and the semiconductor substrate 110, in accordance with some embodiments.

During the erase operation, the internal built-in electric field at the depletion region D1 helps the trapped holes in the first layer 142P to flow to the semiconductor substrate 110, in accordance with some embodiments. Therefore, the internal built-in electric field at the depletion region D1 reduces the erase operation voltage, in accordance with some embodiments. In some embodiments, the erase operation voltage is less than 10 V. In some embodiments, the erase operation voltage ranges from about 3V to about 5V.

In some embodiments, a peripheral charge pump circuitry (not shown) is formed over the semiconductor substrate 110 and is electrically connected to the gate electrode 160 and/or the doped regions 112P and 114P. The peripheral charge pump circuitry is configured to raise the erase operation voltage, in accordance with some embodiments.

Since there is no need to provide a high erase operation voltage (e.g. greater than 10 V), the design of the peripheral charge pump circuitry is simplified, in accordance with some embodiments. Therefore, the process for forming the semiconductor device structure 300 is simplified as well.

In the semiconductor device structure 300, the insulating layer 130 separates the semiconductor substrate 110 from the first layer 142P, in accordance with some embodiments. The second layer 144N is between the first layer 142P and the insulating layer 150, in accordance with some embodiments. The gate electrode 160 is over the insulating layer 150, in accordance with some embodiments.

The first layer 142P is in direct contact with the second layer 144N, in accordance with some embodiments. The first layer 142P is in direct contact with the insulating layer 130, in accordance with some embodiments. The insulating layer 150 is in direct contact with the gate electrode 160 and the second layer 144N, in accordance with some embodiments.

The insulating layer 130 is in direct contact with the semiconductor substrate 110, in accordance with some embodiments. In some embodiments, sidewalls 132, 142, 144, 152, and 162 of the insulating layer 130, the first layer 142P, the second layer 144N, the insulating layer 150, and the gate electrode 160 are aligned with each other.

In some embodiments, the semiconductor substrate 110 has an N-type conductivity. The semiconductor substrate 110 is doped with N-type dopants, such as nitrogen (N), phosphorus (P), arsenic (As), antimony (Sb), or bismuth (Bi). The semiconductor substrate 110 and the second layer 144N have the same type of conductivity, in accordance with some embodiments.

Figure 4A:
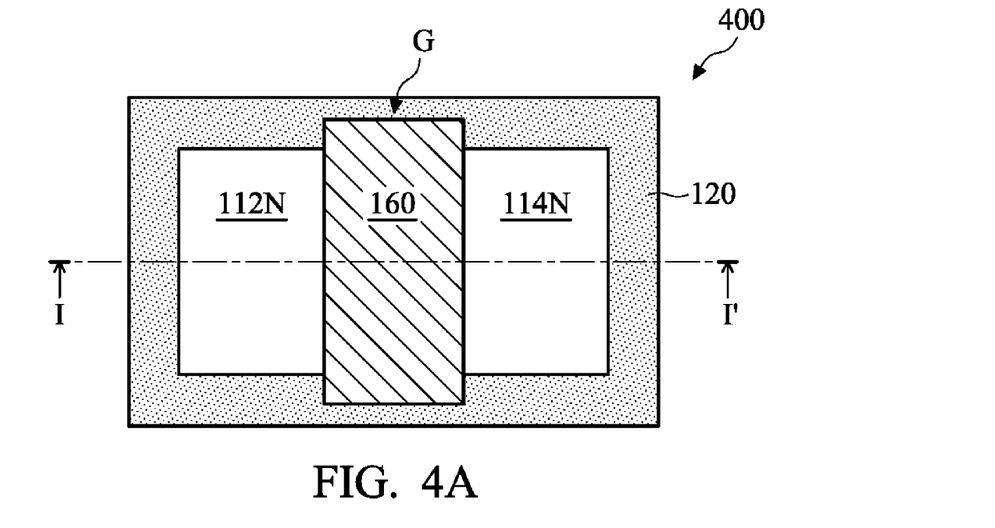
FIG. 4A is a top view of a semiconductor device structure, in accordance with some embodiments.
Figure 4B:
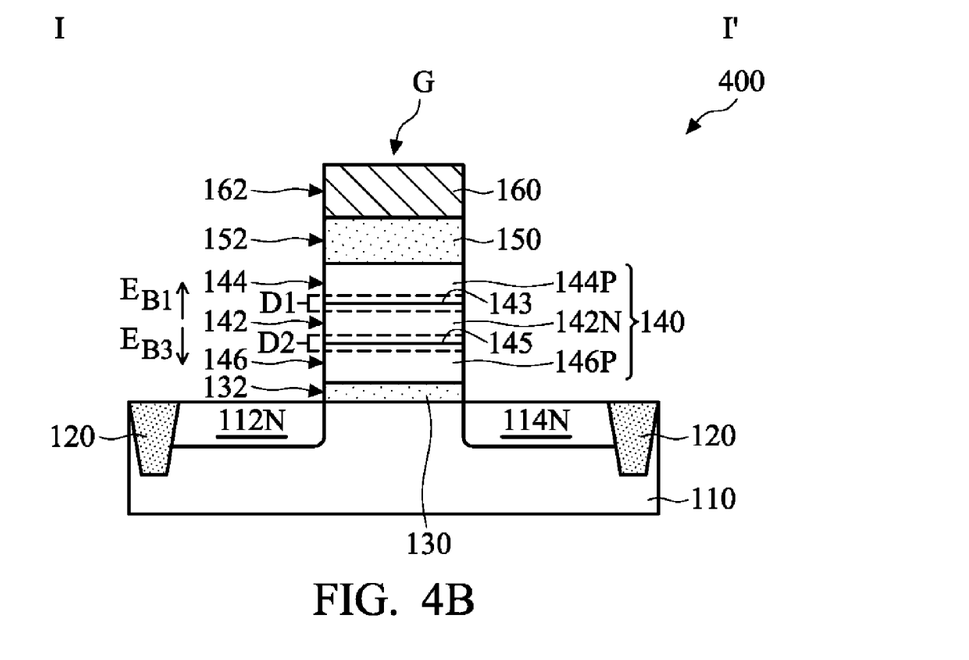
FIG. 4B is a cross-sectional view of the semiconductor device structure 400 along a sectional line I-I' in FIG. 4A, in accordance with some embodiments.

FIG. 4A is a top view of a semiconductor device structure 400, in accordance with some embodiments. FIG. 4B is a cross-sectional view of the semiconductor device structure 400 along a sectional line I-I' in FIG. 4A, in accordance with some embodiments.

As shown in FIGS. 4A and 4B, the material and the structure of the semiconductor device structure 400 are similar to that of the semiconductor device structure 100, except that the charge trapping layer 140 of the semiconductor device structure 400 further includes a third layer 146P, in accordance with some embodiments.

As shown in FIGS. 4A and 4B, a third layer 146P is formed before the formation of the first layer 142N, in accordance with some embodiments. The third layer 146P is between the first layer 142N and the insulating layer 130, in accordance with some embodiments. The third layer 146P has a P-type conductivity, in accordance with some embodiments. The first layer 142N and the third layer 146P are made of different materials, in accordance with some embodiments.

The third layer 146P includes a P-type oxide semiconductor, in accordance with some embodiments. The P-type oxide semiconductor includes nickel oxide, tin oxide, copper oxide, or another suitable P-type oxide semiconductor material. The P-type oxide semiconductor is different from the N-type oxide semiconductor, in accordance with some embodiments.

In some embodiments, the third layer 146P includes a P-type oxynitride semiconductor. The P-type oxynitride semiconductor includes nickel oxynitride, tin oxynitride, copper oxynitride, or another suitable P-type oxynitride semiconductor. The P-type oxynitride semiconductor is different from the N-type oxynitride semiconductor, in accordance with some embodiments.

The third layer 146P is formed using a chemical vapor deposition process and an annealing process or another suitable process. The first layer 142N and the doped regions 112N and 114N have an N-type conductivity, which is opposite to a P-type conductivity of the second layer 144P and the third layer 146P, in accordance with some embodiments.

In the semiconductor device structure 400, the insulating layer 130 separates the semiconductor substrate 110 from the third layer 146P, in accordance with some embodiments. The second layer 144P is between the first layer 142N and the insulating layer 150, in accordance with some embodiments. The gate electrode 160 is over the insulating layer 150, in accordance with some embodiments.

The first layer 142N is in direct contact with the second layer 144P and the third layer 146P, in accordance with some embodiments. The third layer 146P is in direct contact with the insulating layer 130, in accordance with some embodiments. The insulating layer 150 is in direct contact with the gate electrode 160 and the second layer 144P, in accordance with some embodiments. The insulating layer 130 is in direct contact with the semiconductor substrate 110, in accordance with some embodiments.

In some embodiments, sidewalls 132, 142, 144, 146, 152, and 162 of the insulating layer 130, the first layer 142N, the second layer 144P, the third layer 146P, the insulating layer 150, and the gate electrode 160 are aligned with each other.

There is a P-N junction 145 between the first layer 142N and the third layer 146P, in accordance with some embodiments. In some embodiments, a depletion region D2 is formed around the P-N junction 145 and in the first layer 142N and the third layer 146P. In some embodiments, a direction $E_{B3}$ of an internal built-in electric field at the depletion region D2 is from the first layer 142N to the third layer 146P.

During a program operation, electrons in the semiconductor substrate 110 are driven into the first layer 142N through the insulating layer 130 (i.e. the tunnel layer) and the third layer 146P by applying a voltage difference between the gate electrode 160 and the semiconductor substrate 110, in accordance with some embodiments.

The electrons are trapped in the first layer 142N, in accordance with some embodiments. The internal built-in electric field at the depletion region D1 prevents the trapped electrons in the first layer 142N from flowing to the gate electrode 160 through the second layer 144P and the insulating layer 150, in accordance with some embodiments.

The internal built-in electric field at the depletion region D2 prevents the trapped electrons in the first layer 142N from flowing back to the semiconductor substrate 110, in accordance with some embodiments. Therefore, the internal built-in electric fields at the depletion regions D1 and D2 improve the trapped electron storage reliability (i.e. the data storage reliability) of the semiconductor device structure 400 (i.e. the memory device structure), in accordance with some embodiments.

Figure 5A:
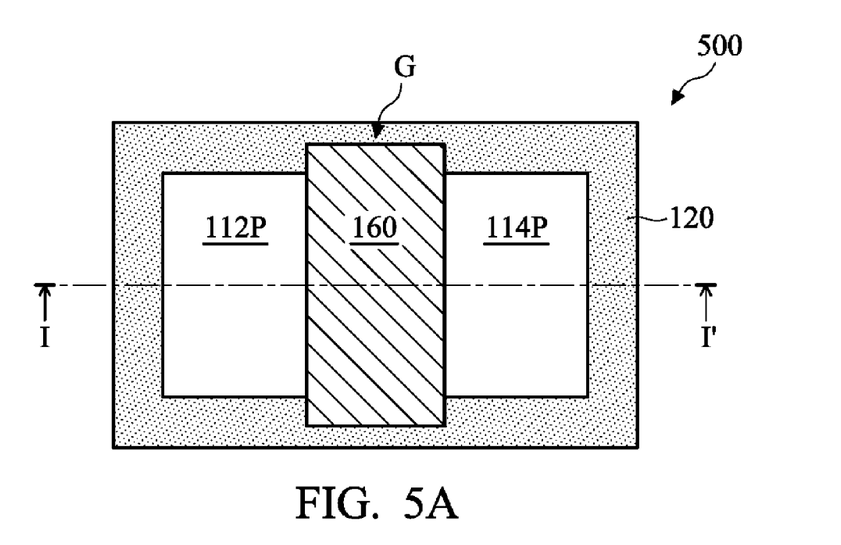
FIG. 5A is a top view of a semiconductor device structure, in accordance with some embodiments.
Figure 5B:
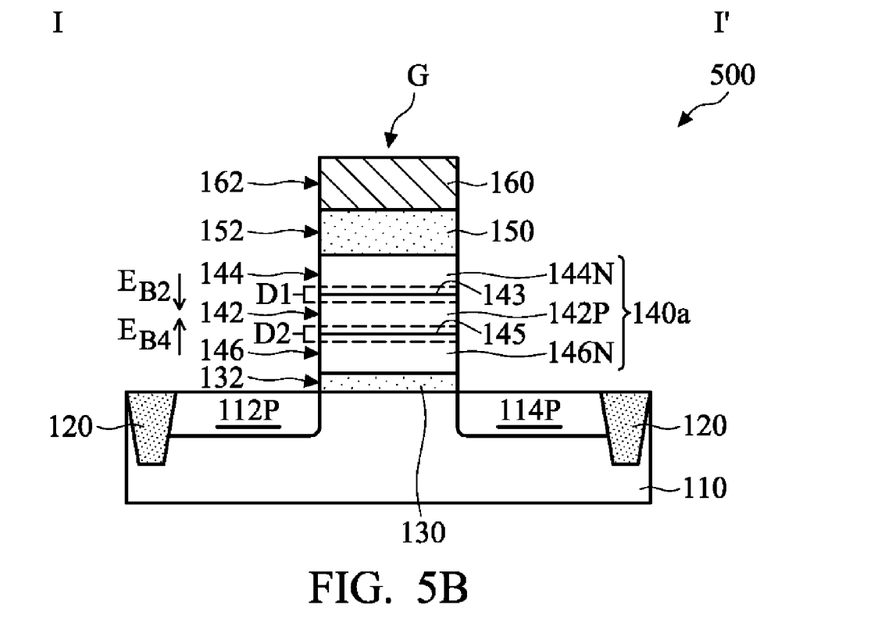
FIG. 5B is a cross-sectional view of the semiconductor device structure along a sectional line I-I' in FIG. 5A, in accordance with some embodiments.

FIG. 5A is a top view of a semiconductor device structure 500, in accordance with some embodiments. FIG. 5B is a cross-sectional view of the semiconductor device structure 500 along a sectional line I-I' in FIG. 5A, in accordance with some embodiments.

As shown in FIGS. 5A and 5B, the material and the structure of the semiconductor device structure 500 are similar to that of the semiconductor device structure 300, except that the charge trapping layer 140a of the semiconductor device structure 500 further includes a third layer 146N, in accordance with some embodiments.

As shown in FIGS. 5A and 5B, a third layer 146N is formed before the formation of the first layer 142P, in accordance with some embodiments. The third layer 146N is between the first layer 142P and the insulating layer 130, in accordance with some embodiments. The third layer 146N has an N-type conductivity, in accordance with some embodiments. The first layer 142P and the third layer 146N are made of different materials, in accordance with some embodiments.

The third layer 146N includes an N-type oxide semiconductor, in accordance with some embodiments. The N-type oxide semiconductor includes zinc oxide, tin dioxide, titanium oxide, zinc tin oxide, indium oxide, indium zinc oxide, indium gallium zinc oxide, or another suitable N-type oxide semiconductor material. The N-type oxide semiconductor is different from the P-type oxide semiconductor, in accordance with some embodiments.

In some embodiments, the third layer 146N includes an N-type oxynitride semiconductor. The N-type oxynitride semiconductor includes zinc oxynitride, tin oxynitride, titanium oxynitride, zinc tin oxynitride, indium oxynitride, indium zinc oxynitride, indium gallium zinc oxynitride, or another suitable N-type oxynitride semiconductor.

The N-type oxynitride semiconductor is different from the N-type oxynitride semiconductor, in accordance with some embodiments. The third layer 146N is formed using a chemical vapor deposition process and an annealing process or another suitable process. The first layer 142P and the doped regions 112P and 114P have a P-type conductivity, which is opposite to an N-type conductivity of the second layer 144N and the third layer 146N, in accordance with some embodiments.

In the semiconductor device structure 500, the insulating layer 130 separates the semiconductor substrate 110 from the third layer 146N, in accordance with some embodiments. The second layer 144N is between the first layer 142P and the insulating layer 150, in accordance with some embodiments. The gate electrode 160 is over the insulating layer 150, in accordance with some embodiments.

The first layer 142P is in direct contact with the second layer 144N and the third layer 146N, in accordance with some embodiments. The third layer 146N is in direct contact with the insulating layer 130, in accordance with some embodiments. The insulating layer 150 is in direct contact with the gate electrode 160 and the second layer 144N, in accordance with some embodiments. The insulating layer 130 is in direct contact with the semiconductor substrate 110, in accordance with some embodiments.

In some embodiments, sidewalls 132, 142, 144, 146, 152, and 162 of the insulating layer 130, the first layer 142P, the second layer 144N, the third layer 146N, the insulating layer 150, and the gate electrode 160 are aligned with each other.

There is a P-N junction 145 between the first layer 142P and the third layer 146N, in accordance with some embodiments. In some embodiments, a depletion region D2 is formed around the P-N junction 145 and in the first layer 142P and the third layer 146N. In some embodiments, a direction $E_{B4}$ of an internal built-in electric field at the depletion region D2 is from the third layer 146N to the first layer 142P.

During a program operation, holes in the semiconductor substrate 110 are driven into the first layer 142P through the insulating layer 130 (i.e. the tunnel layer) and the third layer 146N by applying a voltage difference between the gate electrode 160 and the semiconductor substrate 110, in accordance with some embodiments.

The holes are trapped in the first layer 142P, in accordance with some embodiments. The internal built-in electric field at the depletion region D1 prevents the trapped holes in the first layer 142P from flowing to the gate electrode 160 through the second layer 144N and the insulating layer 150, in accordance with some embodiments.

The internal built-in electric field at the depiction region D2 prevents the trapped holes in the first layer 142P from flowing back to the semiconductor substrate 110, in accordance with some embodiments. Therefore, the internal built-in electric fields at the depletion regions D1 and D2 improve the trapped electron storage reliability (i.e. the data storage reliability) of the semiconductor device structure 500 (i.e. the memory device structure), in accordance with some embodiments.

In accordance with some embodiments, semiconductor device structures and methods for forming the same are provided. The methods (for forming the semiconductor device structure) form a P-N junction in a charge trapping layer of a semiconductor device structure to prevent electrons or holes from flowing into a gate electrode over the charge trapping layer. Therefore, the P-N junction improves the trapped electron storage reliability (i.e. the data storage reliability) of the semiconductor device structure.

In accordance with some embodiments, a semiconductor device structure is provided. The semiconductor device structure includes a semiconductor substrate. The semiconductor device structure includes a gate stack over the semiconductor substrate. The gate stack includes a first insulating layer, a first layer, a second layer, a second insulating layer, and a gate electrode. The first insulating layer separates the semiconductor substrate from the first layer. The second layer is between the first layer and the second insulating layer. The gate electrode is over the second insulating layer. There is a P-N junction between the first layer and the second layer. The semiconductor device structure includes a first doped region and a second doped region in the semiconductor substrate and on two opposite sides of the gate stack. The first layer, the first doped region, and the second doped region have a first type conductivity, which is opposite to a second type conductivity of the second layer.

In accordance with some embodiments, a semiconductor device structure is provided. The semiconductor device structure includes a semiconductor substrate. The semiconductor device structure includes a gate stack over the semiconductor substrate. The gate stack includes a first insulating layer, a first layer, a second layer, a third layer, a second insulating layer, and a gate electrode. The first insulating layer separates the semiconductor substrate from the third layer. The first layer is between the second layer and the third layer. The second insulating layer is between the second layer and the gate electrode. The semiconductor device structure includes a first doped region and a second doped region in the semiconductor substrate and on two opposite sides of the gate stack. The first layer, the first doped region, and the second doped region have a first type conductivity, which is opposite to a second type conductivity of the second layer and the third layer.

In accordance with some embodiments, a semiconductor device structure is provided. The semiconductor device structure includes a semiconductor substrate. The semiconductor device structure includes a gate stack over the semiconductor substrate. The gate stack includes a first insulating layer, a charge trapping structure, a second insulating layer, and a gate electrode. The first insulating layer separates the semiconductor substrate from the charge trapping structure. The charge trapping structure is between the first insulating layer and the second insulating layer. The gate electrode is over the second insulating layer. There is a first P-N junction in the charge trapping structure. The semiconductor device structure includes a first doped region and a second doped region in the semiconductor substrate and on two opposite sides of the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a semiconductor substrate;
a gate stack over the semiconductor substrate, wherein the gate stack comprises a first insulating layer, a first layer, a second layer, a second insulating layer, and a gate electrode, the first insulating layer separates the semiconductor substrate from the first layer, the second layer is between the first layer and the second insulating layer, the gate electrode is over the second insulating layer, and there is a P-N junction between the first layer and the second layer; and
a first doped region and a second doped region in the semiconductor substrate and on two opposite sides of the gate stack, wherein the first layer, the first doped region, and the second doped region have a first type conductivity, which is opposite to a second type conductivity of the second layer.

2. The semiconductor device structure as claimed in claim 1, wherein the first layer is in direct contact with the second layer.

3. The semiconductor device structure as claimed in claim 1, wherein the first conductivity type and the second conductivity type comprise an N-type conductivity and a P-type conductivity.

4. The semiconductor device structure as claimed in claim 3, wherein the first conductivity type is the N-type conductivity, the first layer comprises an N-type oxide semiconductor, and the second layer comprises a P-type oxide semiconductor.

5. The semiconductor device structure as claimed in claim 4, wherein the N-type oxide semiconductor comprises zinc oxide, tin dioxide, titanium oxide, zinc tin oxide, indium oxide, indium zinc oxide, and indium gallium zinc oxide, and the P-type oxide semiconductor comprises nickel oxide, tin oxide, and copper oxide.

6. The semiconductor device structure as claimed in claim 3, wherein the first conductivity type is the N-type conductivity, the first layer comprises a first oxynitride semiconductor, and the second layer comprises a second oxynitride semiconductor, which is different from the first oxynitride semiconductor.

7. The semiconductor device structure as claimed in claim 6, wherein the first oxynitride semiconductor comprises zinc oxynitride, tin oxynitride, titanium oxynitride, zinc tin oxynitride, indium oxynitride, indium zinc oxynitride, and indium gallium zinc oxynitride, and the P-type oxide semiconductor comprises nickel oxynitride, tin oxynitride, and copper oxynitride.

8. The semiconductor device structure as claimed in claim 1, wherein a first side wall of the first layer and a second sidewall of the second layer are aligned with each other.

9. The semiconductor device structure as claimed in claim 4, wherein the N-type oxide semiconductor comprises a first metal oxide, and the P-type oxide semiconductor comprises a second metal oxide, which is different from the first metal oxide.

10. A semiconductor device structure, comprising:
   a semiconductor substrate;
   a gate stack over the semiconductor substrate, wherein the gate stack comprises a first insulating layer, a charge trapping structure, a second insulating layer, and a gate electrode, the first insulating layer separates the semiconductor substrate from the charge trapping structure, the charge trapping structure is between the first insulating layer and the second insulating layer, the gate electrode is over the second insulating layer, and there is a first P-N junction in the charge trapping structure; and
   a first doped region and a second doped region in the semiconductor substrate and on two opposite sides of the gate stack.

11. The semiconductor device structure as claimed in claim 10, wherein the first P-N junction is between a first layer and a second layer of the charge trapping structure, the first layer is between the first insulating layer and the second layer, and the first layer, the first doped region, and the second doped region have a first type conductivity, which is opposite to a second type conductivity of the second layer.

12. The semiconductor device structure as claimed in claim 11, wherein the first layer comprises a first oxide semiconductor, and the second layer comprises a second oxide semiconductor, which is different from the first oxide semiconductor.

13. The semiconductor device structure as claimed in claim 11, wherein a first side wall of the first layer and a second sidewall of the second layer are aligned with each other.

14. The semiconductor device structure as claimed in claim 11, wherein the first layer is in direct contact with the second layer.

15. A semiconductor device structure, comprising:
   a semiconductor substrate;
   a gate stack over the semiconductor substrate, wherein the gate stack comprises a first insulating layer, a first layer, a second layer, a second insulating layer, and a gate electrode, the first insulating layer separates the semiconductor substrate from the first layer, the second layer is between the first layer and the second insulating layer, the gate electrode is over the second insulating layer, there is a P-N junction between the first layer and the second layer, and the first layer is in direct contact with the first insulating layer and the second layer; and
   a first doped region and a second doped region in the semiconductor substrate and on two opposite sides of the gate stack, wherein the first layer, the first doped region, and the second doped region have a first type conductivity, which is opposite to a second type conductivity of the second layer.

16. The semiconductor device structure as claimed in claim 15, wherein the second layer is in direct contact with the second insulating layer.

17. The semiconductor device structure as claimed in claim 16, wherein the second insulating layer is in direct contact with the gate electrode.

18. The semiconductor device structure as claimed in claim 15, wherein a first side wall of the first layer and a second sidewall of the second layer are aligned with each other.

19. The semiconductor device structure as claimed in claim 18, wherein the first side wall of the first layer, the second sidewall of the second layer, a third side wall of the first insulating layer, and a fourth side wall of the second insulating layer are aligned with each other.

20. The semiconductor device structure as claimed in claim 18, wherein the second insulating layer is thicker than the first insulating layer.

* * * * *